(12) United States Patent
Lee et al.

(10) Patent No.: US 12,256,620 B2
(45) Date of Patent: Mar. 18, 2025

(54) DISPLAY DEVICE

(71) Applicant: Samsung Display Co., LTD., Yongin-si (KR)

(72) Inventors: Eunggyu Lee, Cheonan-si (KR); Hong-Jo Park, Asan-si (KR); Beohmrock Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 497 days.

(21) Appl. No.: 17/551,790

(22) Filed: Dec. 15, 2021

(65) Prior Publication Data

US 2022/0367574 A1    Nov. 17, 2022

(30) Foreign Application Priority Data

May 13, 2021    (KR) .................. 10-2021-0061807

(51) Int. Cl.
*H10K 59/38*    (2023.01)
*H10K 59/35*    (2023.01)
*H10K 59/65*    (2023.01)

(52) U.S. Cl.
CPC ........... *H10K 59/38* (2023.02); *H10K 59/353* (2023.02); *H10K 59/65* (2023.02)

(58) Field of Classification Search
CPC .... H10K 59/353; H10K 59/121; H10K 59/65; H10K 59/38; H10K 50/865; H10K 50/86; H10K 59/122; H10K 59/35; H10K 50/844; H10K 50/858; H10K 59/126; H10K 59/40; H10K 59/8723; H10K 59/128; H10K 59/50; H10K 50/868; H10K 50/8445; H10K 59/60; H10K 59/124; H10K 59/1201; H10K 59/873; H10K 50/852; H10K 59/123; H10K 50/131; H10K 59/30; H10K 59/876; H10K 2102/3031; H10K 2102/3026; H04M 1/026; H04M 1/0264; H04M 1/0266; H04M 2250/12; G06F 3/0412; G06F 3/044; G06F 1/163; G02F 1/133528; G02F 1/133512; G02F 1/13363; G02F 1/133502; G02F 1/137; G02F 1/1368; G02F 1/136222; G02F 1/133638; G02F 2413/05; G02F 2413/01; G02F 2201/121; G02F 2201/52;

(Continued)

(56) References Cited

U.S. PATENT DOCUMENTS 9,905,616 B2    2/2018  Song et al.
2006/0274233 A1*  12/2006  Takizawa .......... G02F 1/133514
                                                    349/114

(Continued)

FOREIGN PATENT DOCUMENTS

KR    10-0527187 B1    11/2005
KR    10-0624307 B1    9/2006

(Continued)

*Primary Examiner* — Mouloucoulaye Inoussa
(74) *Attorney, Agent, or Firm* — CANTOR COLBURN LLP

(57) ABSTRACT

A display device includes a substrate, a light emitting diode layer on the substrate and including light emitting diodes which emit light, a color filter layer on the light emitting diode layer and including color filters corresponding to the light emitting diodes, an overcoat layer on the color filter layer and including a colorant, and a window on the overcoat layer.

20 Claims, 11 Drawing Sheets

(58) Field of Classification Search
CPC ............ G02F 2413/14; G02F 2201/44; G02F 2201/123; H04N 23/54; H04N 23/57; G02B 5/201; G02B 5/288; G02B 27/0172; G02B 2027/0112; G02B 2027/0178

See application file for complete search history.

(56) References Cited

U.S. PATENT DOCUMENTS

| | | | |
|---|---|---|---|
| 2007/0237929 A1* | 10/2007 | Suga | B32B 27/32 428/195.1 |
| 2018/0188866 A1* | 7/2018 | Heo | H10K 59/40 |
| 2018/0190735 A1* | 7/2018 | Son | G02F 1/133528 |
| 2018/0197921 A1* | 7/2018 | Kim | H10K 71/00 |
| 2020/0019029 A1* | 1/2020 | Park | G09G 3/3607 |
| 2021/0066648 A1* | 3/2021 | Chung | H10K 50/865 |
| 2021/0066663 A1* | 3/2021 | Joung | G02B 5/201 |
| 2021/0249635 A1* | 8/2021 | Cho | H10K 59/121 |
| 2022/0077248 A1* | 3/2022 | Heo | H10K 71/00 |
| 2022/0093708 A1* | 3/2022 | Cho | H10K 59/1213 |
| 2023/0006007 A1* | 1/2023 | Jo | H10K 50/8428 |
| 2023/0157087 A1* | 5/2023 | Shi | H10K 59/1201 257/72 |

FOREIGN PATENT DOCUMENTS

| | | |
|---|---|---|
| KR | 10-0659576 B1 | 12/2006 |
| KR | 1020100029885 A | 3/2010 |
| KR | 1020170025555 A | 3/2017 |
| KR | 20170049782 A | 5/2017 |
| KR | 10-1937456 B1 | 1/2019 |
| KR | 10-2123686 B1 | 6/2020 |

\* cited by examiner

DISPLAY DEVICE

This application claims priority to Korean Patent Application No. 10-2021-0061807, filed on May 13, 2021, and all the benefits accruing therefrom under 35 U.S.C. § 119, the content of which in its entirety is herein incorporated by reference.

BACKGROUND

1. Field

Embodiments of the invention relate generally to a display device. More particularly, embodiments of the invention relate to a display device including an overcoat layer.

2. Description of the Related Art

As the display device includes wires and electrodes which include metal, external light incident on the display device may be reflected from the wires and the electrodes. In order to prevent such external light from being reflected, a display device generally includes a polarizer.

SUMMARY

A polarizer in a conventional display device may prevent reflection of external light, but transmittance in a light transmission area of the conventional display device may be reduced due to the polarizer.

Embodiments provide a display device with reduced external light reflection.

An embodiment of a display device includes a substrate, a light emitting diode layer on the substrate and including light emitting diodes which emit light, a color filter layer on the light emitting diode layer and including color filters corresponding to the light emitting diodes, an overcoat layer on the color filter layer and including a colorant, and a window on the overcoat layer.

In an embodiment, the colorant may include an organic pigment.

In an embodiment, the organic pigment may include acetylene black, aniline black or perylene black.

In an embodiment, the colorant may include a red pigment, a green pigment or a blue pigment.

In an embodiment, the red pigment may include a pigment having a reddish color, the green pigment may include a pigment having a greenish color, and the blue pigment may include a pigment having a bluish color.

In an embodiment, the substrate may include a display area including the light emitting diodes and having a first transmittance and a transmission area adjacent to the display area and having a second transmittance different from the first transmittance. A first thickness of the overcoat layer overlapping the display area may be different from a second thickness of the overcoat layer overlapping the transmission area.

In an embodiment, the second transmittance may be greater than the first transmittance, and the second thickness may be smaller than the first thickness.

In an embodiment, the second transmittance may be smaller than the first transmittance, and the second thickness may be greater than the first thickness.

In an embodiment, the first thickness may be greater than about 1.5 micrometers (um) and smaller than about 3 um.

In an embodiment, the display device may further include a functional module under the substrate and overlapping the transmission area.

In an embodiment, a number per unit area of the light emitting diodes in the transmission area may be smaller than a number per unit area of the light emitting diodes in the display area.

In an embodiment, the display device may further include an adhesion layer between the overcoat layer and the window and adhering the window to the overcoat layer.

In an embodiment, the adhesion layer may include a pressure sensitive adhesive, an optically clear adhesive or an optically transparent resin.

In an embodiment, the overcoat layer may further include an ultraviolet absorber for shielding light having a wavelength of less than about 380 nanometers (nm).

In an embodiment, the overcoat layer may have a transmittance greater than about 75% and smaller than about 90% for light having a wavelength greater than about 380 nm and smaller than about 700 nm.

In an embodiment, the light emitting diodes may include a red light emitting diode which emits red light, a green light emitting diode which emits green light, and a blue light emitting diode which emits blue light. A thickness of the red light emitting diode, a thickness of the green light emitting diode, and a thickness of the blue light emitting diode may be different from each other.

An embodiment of display device includes a substrate including a display area having a first transmittance and a transmission area having a second transmittance different from the first transmittance, a light emitting diode layer on the substrate, overlapping the display area, and including light emitting diodes which emit light, a color filter layer on the light emitting diode layer and including color filters corresponding to the light emitting diodes, an overcoat layer on the color filter layer, and having a first thickness overlapping the display area and a second thickness overlapping the transmission area, where the second thickness is different from the first thickness, and a window on the overcoat layer.

In an embodiment, the overcoat layer may include a colorant.

In an embodiment, the second transmittance may be greater than the first transmittance, and the second thickness may be smaller than the first thickness.

In an embodiment, the second transmittance may be smaller than the first transmittance, and the second thickness may be greater than the first thickness.

Therefore, one or more embodiment of a display device may include an overcoat layer to which a colorant is added. As the colorant is added to the overcoat layer, transmittance of the overcoat layer may be reduced. Accordingly, external light reflected from a component (e.g., a common electrode) included within a stacked structure of the display device may not be recognized from outside the display device, and display quality of the display device may be improved.

In addition, the transmittance of the overcoat layer may be related to a content of the colorant and/or a thickness of the overcoat layer. In embodiments, for example, when the transmission area has a relatively high transmittance, a thickness of the overcoat layer overlapping the transmission area may be relatively small.

In addition, as the overcoat layer overlapping the display area has a flat top surface, the reflective color band phenomenon of the display device may be improved. Furthermore, by adjusting thicknesses of each of the light emitting diodes, the reflective color band phenomenon may be further improved.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
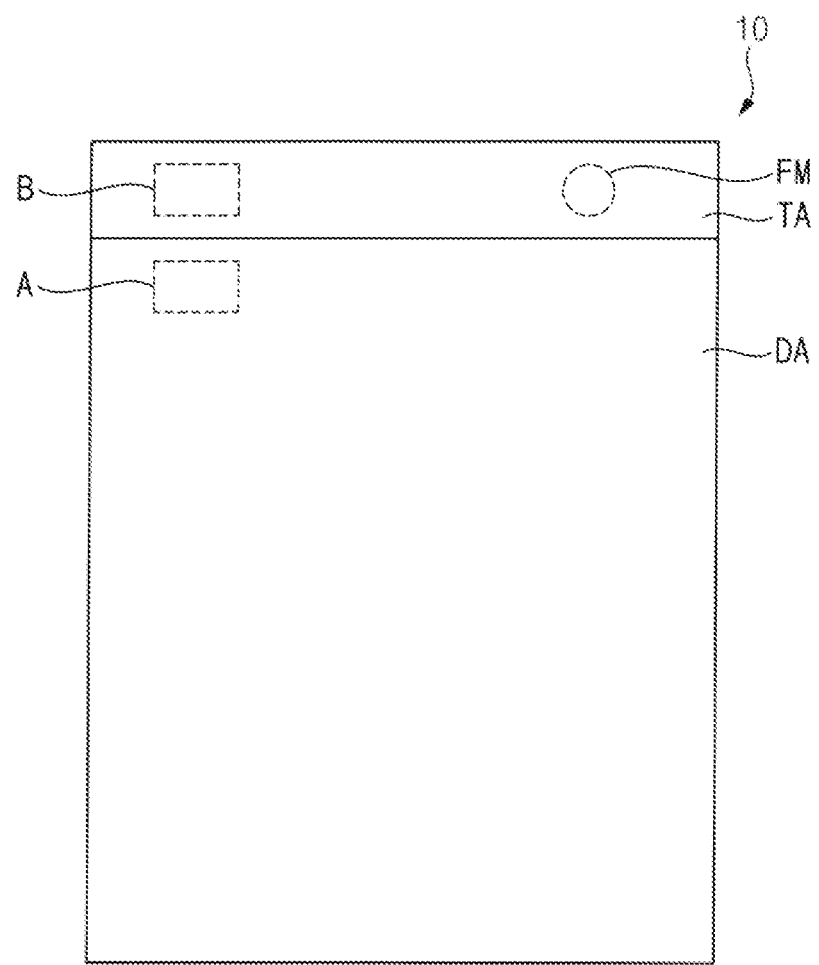
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 2:
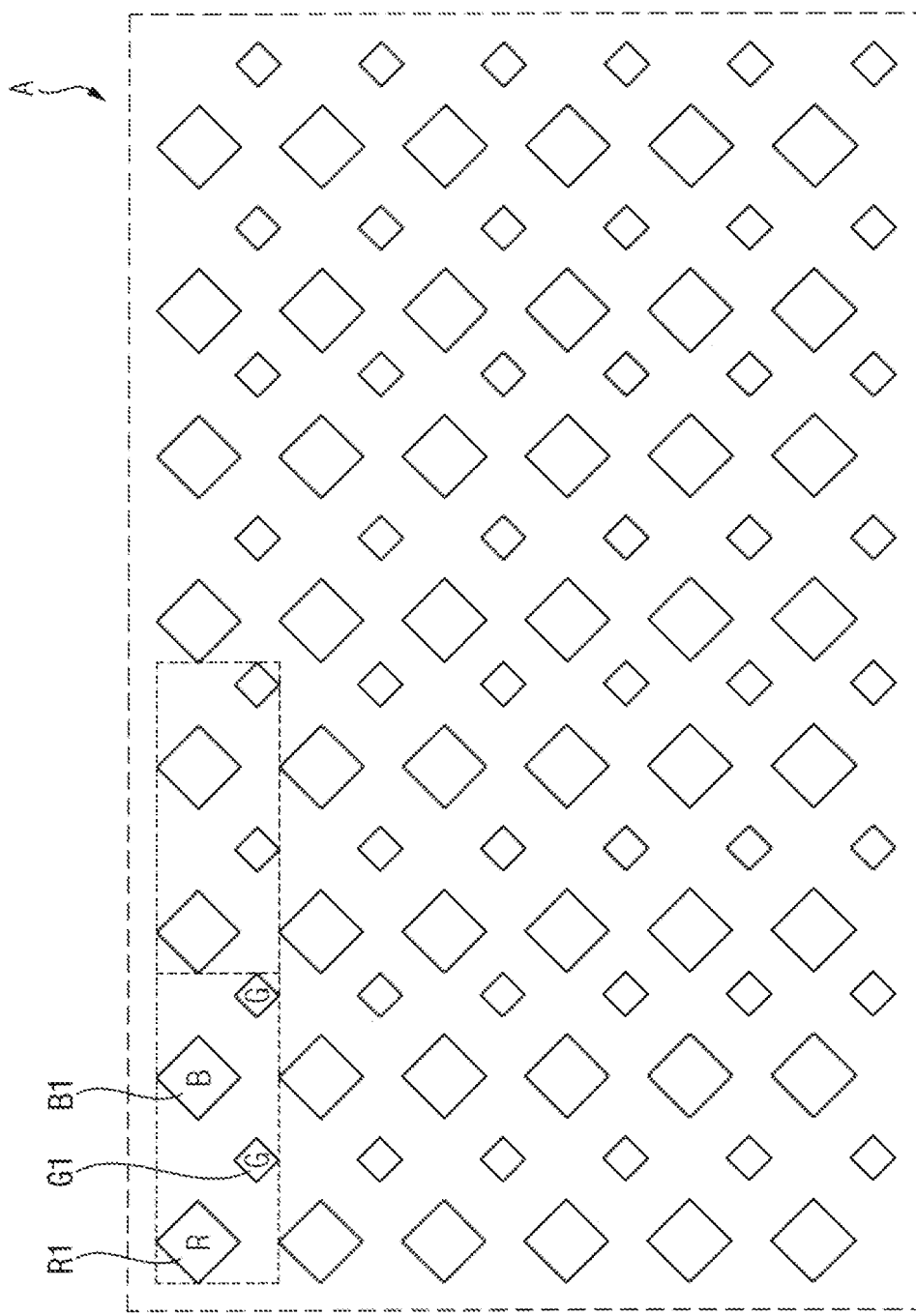
FIG. 2 is an enlarged plan view of area A of FIG. 1.
Figure 3:
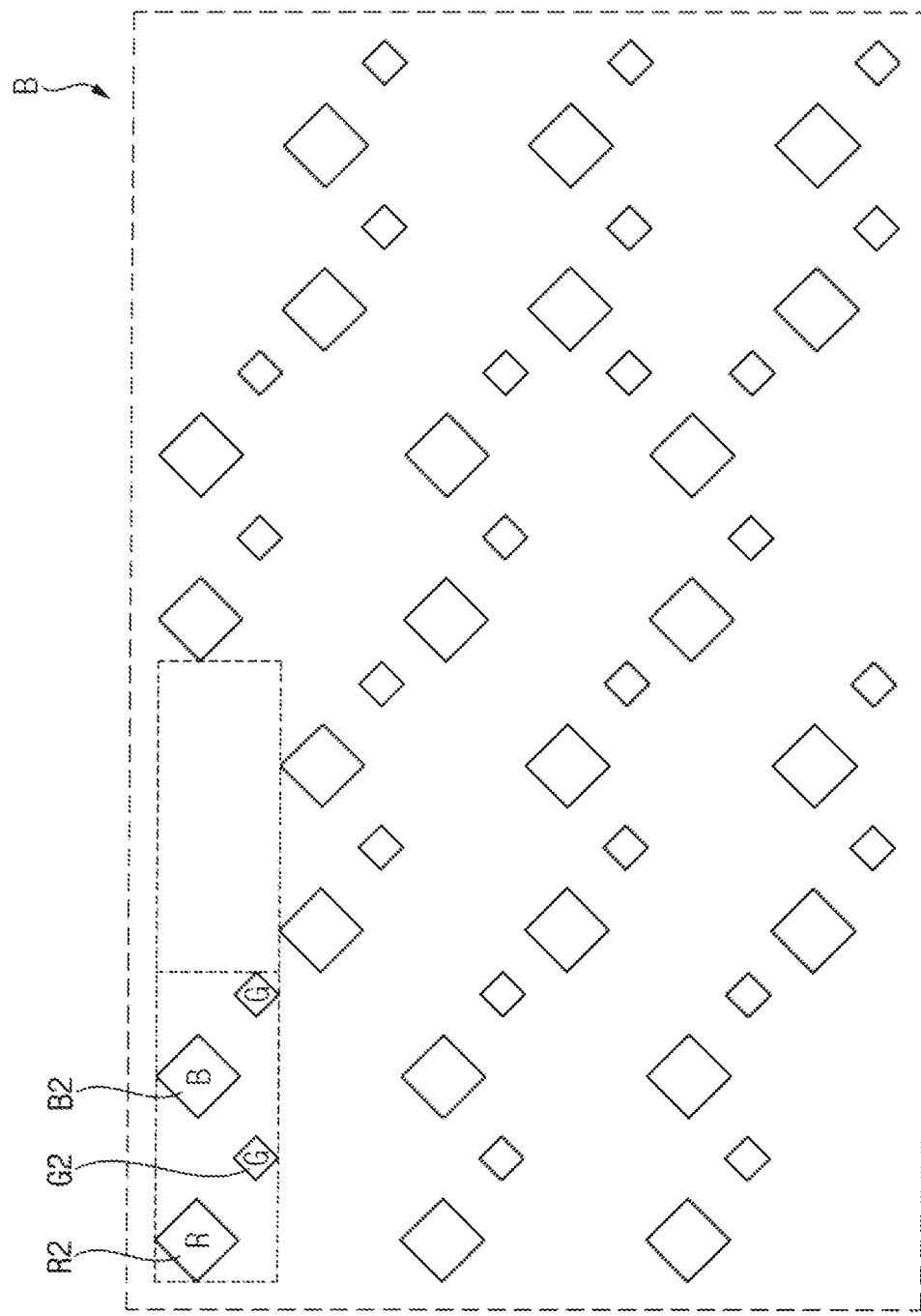
FIG. 3 is an enlarged plan view of area B of FIG. 1.

FIG. 1 is a plan view illustrating an embodiment of a display device 10. FIG. 2 is an enlarged plan view of area A of FIG. 1. FIG. 3 is an enlarged plan view of area B of FIG. 1.

Referring to FIG. 1, a display device 10 may be divided into a display area DA and a transmission area TA which is adjacent to the display area DA. In an embodiment, as shown in FIG. 1, the transmission area TA may be positioned at one side of the display area DA and may have a rectangular shape in the plan view. Referring to FIG. 1, the transmission area TA may be adjacent to the display area DA along a first direction in the plan view. However, the transmission area TA is not limited thereto. In an embodiment, for example, the transmission area TA may be positioned to surround the display area DA in the plan view. In addition, the transmission area TA may have a circular shape, an elliptical shape, and/or a polygonal shape as a planar shape.

An image may be displayed in the display area DA and the transmission area TA, and a functional module FM may be disposed in the transmission area TA. The overall display area of the display device 10 may include a plurality of display areas including both the display area DA (e.g., first display area or first light transmission area) and the transmission area TA (e.g., second display area or second light transmission area). The functional module FM may provide a function to the display device 10 and may use light, pressure, etc. to provide the function. The functional module FM may be a camera module for photographing (or recognizing) an image of an object located in front of the display device 10, a face recognition sensor module for detecting a face such as a user's face, and a pupil recognition sensor module for detecting a pupil of an eye such as a user's pupils, an acceleration sensor module and a geomagnetic sensor module for determining a movement of the display device 10, a proximity sensor module and an infrared sensor module for detecting whether the front of the display device 10 is in proximity to an object, an illuminance sensor module for measuring a degree of external brightness, and the like.

In FIG. 1, one of the functional module FM is illustrated as being positioned on the left side of the transmission area TA, but the invention is not limited thereto. In an embodiment, for example, two or more of the functional module FM including a plurality of functional modules FM may be disposed within the display device 10, and may be disposed at various positions within a planar area overlapping (or corresponding to) the transmission area TA.

A first transmittance (e.g., a first light transmittance) of the display area DA may be different from a second transmittance (e.g., second light transmittance) of the transmission area TA.

In an embodiment, the second transmittance of the transmission area TA may be greater than the first transmittance of the display area DA. Accordingly, a light collecting efficiency of the functional module FM overlapping the transmission area TA may be increased. In other words, as the second transmittance is relatively larger than the first transmittance, the amount of light incident to the functional module FM may be increased.

In an embodiment, the second transmittance of the transmission area TA may be smaller than the first transmittance of the display area DA. Accordingly, light reflected inside of the display device 10 may not be transmitted toward the front surface of the display device 10. Accordingly, the quality of the image displayed in the transmission area TA (e.g., resolution of image, contrast ratio of image, etc.) may be improved.

In the display device 10, the second transmittance may be set to be greater than the first transmittance or may be set to be smaller than the first transmittance as needed. In addition, the first and second transmittances are not limited thereto. In an embodiment, for example, the first and second transmittances may be equal to each other.

Referring to FIG. 2, a plurality of first light emitting diodes R1, G1, and B1 (e.g., plurality of first light emitting elements) may be disposed in the display area DA. In an embodiment, for example, the first light emitting diodes R1, G1, and B1 may be arranged in an RGBG shape (e.g., red green blue green shape). In an embodiment, the first light emitting diodes R1, G1, and B1 may include a first red light emitting diode R1 (e.g., first red light emitting element), a first green light emitting diode G1 (e.g., first green light emitting element), and a first blue light emitting diode B1 (e.g., first blue light emitting element). The first red light emitting diode R1 may emit red light, the first green light emitting diode G1 may emit green light, and the first blue light emitting diode B1 may emit blue light.

Referring to FIG. 3, a plurality of second light emitting diodes R2, G2, and B2 (e.g., plurality of second light emitting elements) may be disposed in the transmission area TA. In an embodiment, for example, the second light emitting diodes R2, G2, and B2 may be arranged in an RGBG shape. In an embodiment, the second light emitting diodes R2, G2, and B2 may include a second red light emitting diode R2 (e.g., second red light emitting element), a second green light emitting diode G2 (e.g., second green light emitting element), and a second blue light emitting diode B2 (e.g., second blue light emitting element).

In an embodiment, as shown in FIGS. 2 and 3, the light emitting elements are disposed in a number within a unit area (e.g., a number of light emitting elements in the unit area). The number of respective light emitting elements per unit area may define a respective light transmittance, without being limited thereto. The number of light emitting elements per unit area of the second light emitting diodes R2, G2, and B2 disposed in the transmission area TA may be equal to or smaller than the number of light emitting elements per unit area of the first light emitting diodes R1, G1, B1 disposed in the display area DA. Accordingly, the second transmittance of the transmission area TA may be greater than the first transmittance of the display area DA, owing to the lower number of light emitting elements per unit area in the transmission area TA. Referring to FIGS. 2 and 3, a unit area may be represented by a total planar area indicated by the two dotted line boxes. A planar area of the unit area of the display device 10 and various components or layers thereof may be defined along the first direction and a second direction crossing the first direction. However, the invention is not limited thereto.

In a plan view, each of the light emitting elements may have or occupy a planar area. In an embodiment, the planar areas of the first light emitting diodes R1, G1, and B1 may be different from the planar areas of the second light emitting diodes R2, G2, and B2, respectively. In an embodiment, for example, the planar areas of the first light emitting diodes R1, G1, and B1 may be greater than the planar areas of the second light emitting diodes R2, G2, and B2, respectively, such that the second transmittance of the transmission area TA may be greater than the first transmittance of the display area DA, owing to smaller planar areas of the light emitting elements in the transmission area TA. The sizes or planar areas of respective light emitting elements per unit area may define a respective light transmittance, without being limited thereto.

Figure 4:
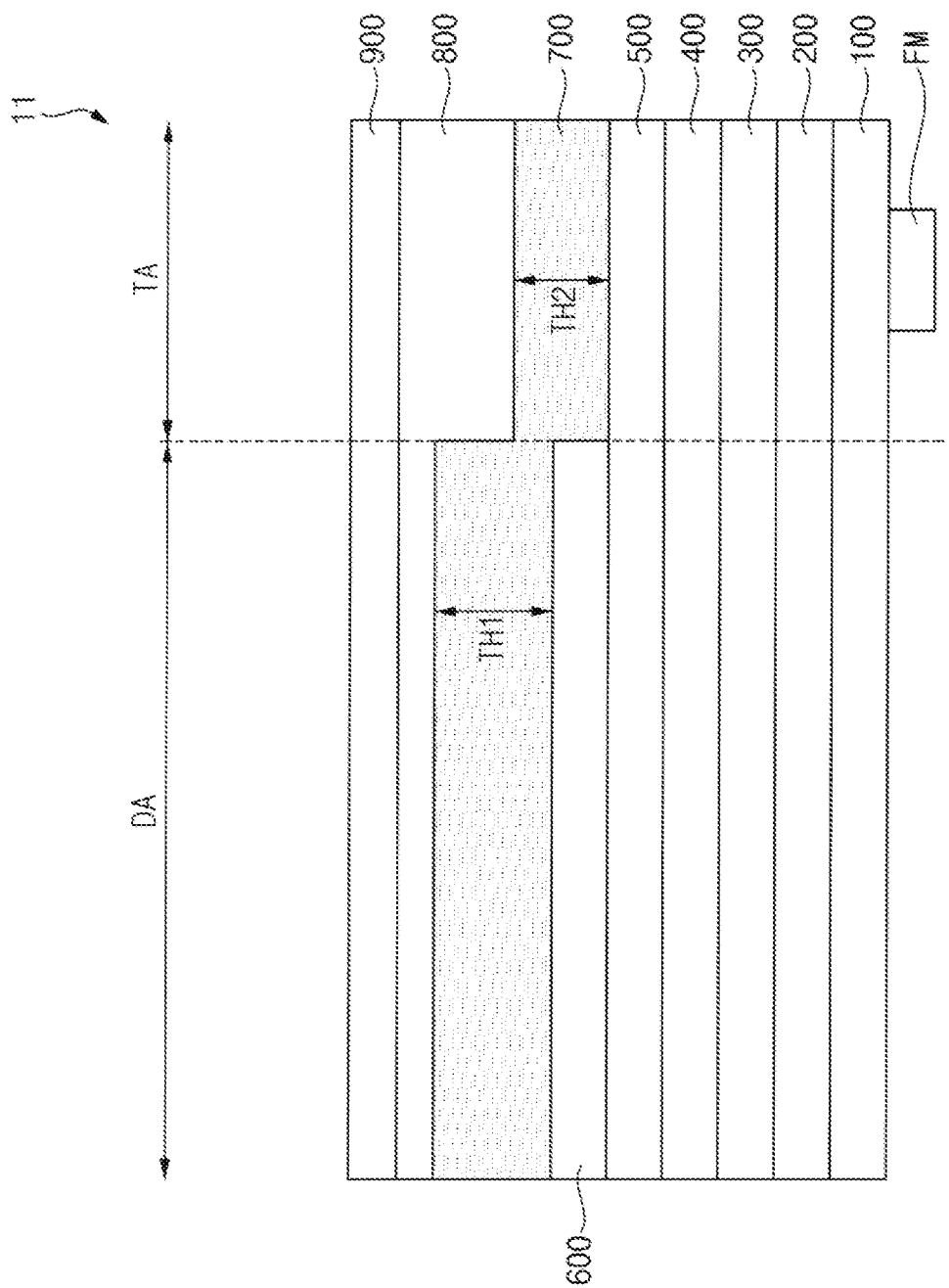
FIG. 4, FIG. 5, and FIG. 6 are cross-sectional views illustrating an embodiment of a display device.
Figure 5:
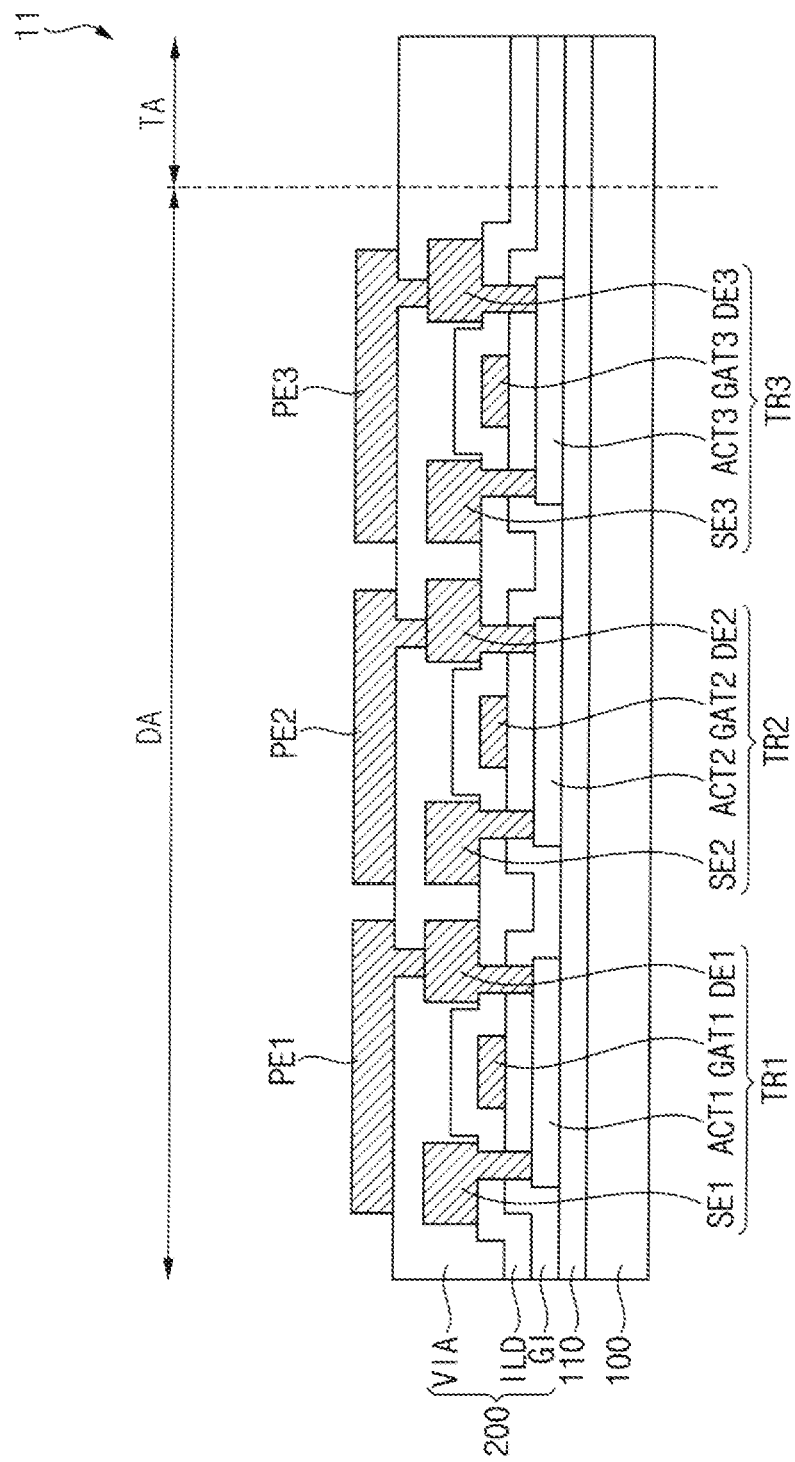
Figure 6:
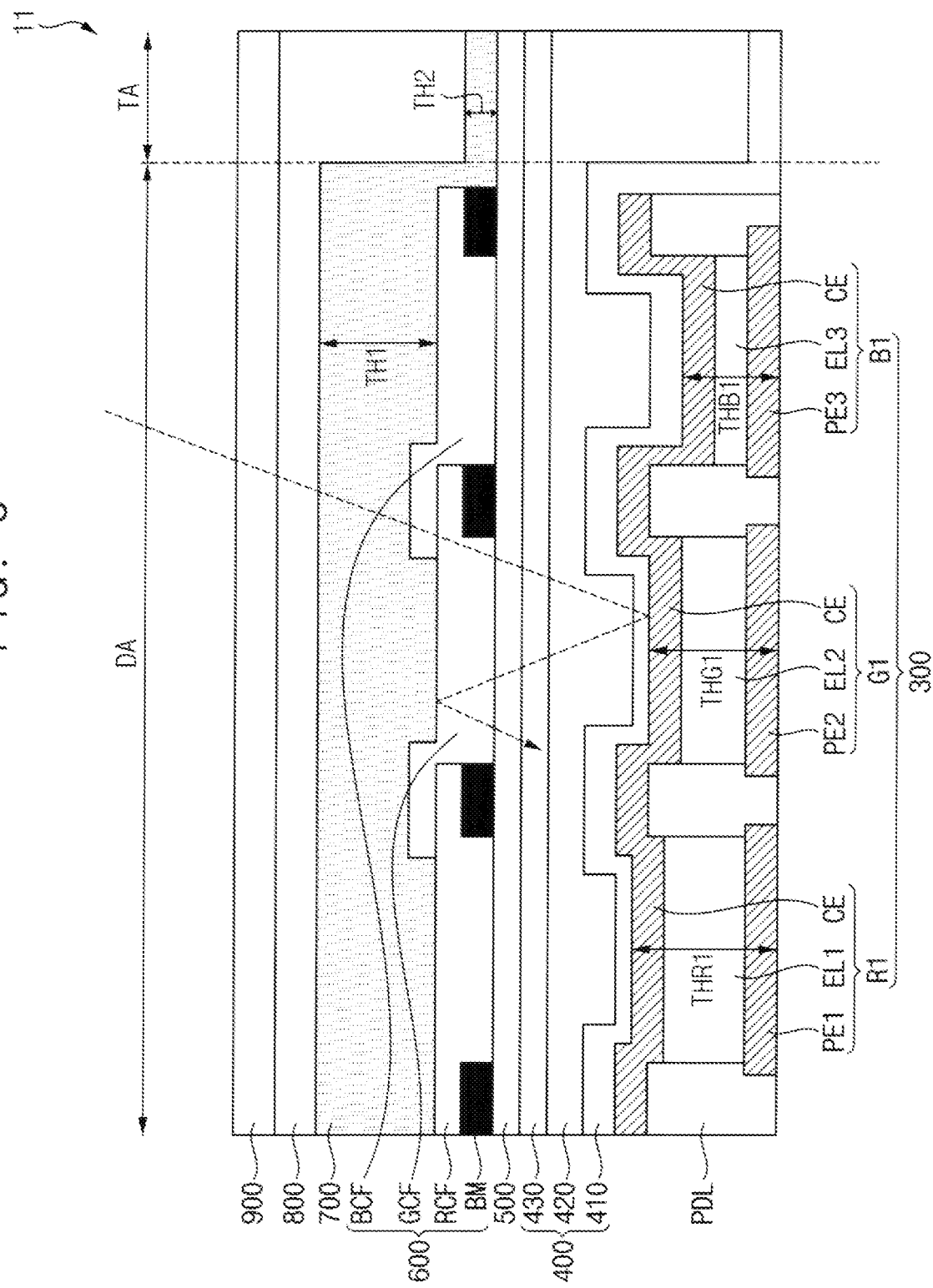

FIG. 4, FIG. 5, and FIG. 6 are cross-sectional views illustrating an embodiment of a display device 11. In an embodiment, for example, FIG. 4 is a cross-sectional view schematically illustrating the display device 11, and FIG. 5 and FIG. 6 are cross-sectional view specifically illustrating the display device 11. In addition, FIG. 5 is a cross-sectional view illustrating a substrate 100 and a transistor layer 200 which are included in the display device 11, and FIG. 6 is a cross-sectional view illustrating a light emitting diode layer 300 (e.g., light emitting element layer), an encapsulation layer 400, a sensing layer 500, a color filter layer 600, an overcoat layer 700, an adhesion layer 800, and a window 900 which are included in the display device 11.

Referring to FIGS. 4 and 5, the display device 11 may include the functional module FM, a substrate 100, a buffer layer 110, a transistor layer 200, a light emitting diode layer 300, an encapsulation layer 400, a sensing layer 500, a color filter layer 600, an overcoat layer 700, an adhesion layer 800, and a window 900. In an embodiment, a buffer layer 110, a transistor layer 200, a light emitting diode layer 300, an encapsulation layer 400, a sensing layer 500, a color filter layer 600, an overcoat layer 700, an adhesion layer 800, and a window 900 may be in order from the functional module FM and/or the substrate 100. That is, the functional module FM faces the light emitting diode layer 300 with the substrate 100 therebetween.

A thickness of the display device 11 and various components or layers thereof may be defined along a third direction crossing each of the first direction and the second direction. In an embodiment, a first thickness TH1 of the overcoat layer 700 overlapping the display area DA may be different from a second thickness TH2 of the overcoat layer 700 overlapping the transmission area TA. The first thickness TH1 and the second thickness TH2 may be set according to respective transmittances of the display area DA and the transmission area TA. In an embodiment, for example, as shown in FIG. 4, the first thickness TH1 may be greater than the second thickness TH2. Accordingly, the first transmittance of the display area DA may be smaller than the second transmittance of the transparent area TA owing to the larger thickness of the overcoat layer 700 which corresponds to the display area DA. In other words, the transmittance of the transmission area TA may be increased owing to the smaller thickness of the overcoat layer 700 which corresponds to the transmission area TA.

The transistor layer 200 may include first to third active patterns ACT1, ACT2, ACT3, first to third gate electrodes GAT1, GAT2, and GAT3, first to third source electrodes SE1, SE2, and SE3, first to third drain electrodes DE1, DE2, and DE3, a gate insulating layer GI, an interlayer insulating layer ILD, and a via insulating layer VIA. The first to third active patterns ACT1, ACT2, and ACT3, the first to third gate electrodes GAT1, GAT2, and GAT3, the first to third source electrodes SE1, SE2, and SE3, and the first to third drain electrodes DE1, DE2, and DE3 may constitute first to third transistors TR1, TR2, and TR3, respectively.

In an embodiment, as shown in FIG. 4, the color filter layer 600 may overlap the display area DA and may not overlap the transmission area TA (e.g., may be adjacent to or spaced apart from the transmission area TA). However, the invention is not limited thereto. In an embodiment, the color filter layer 600 may overlap both the display area DA and the transmission area TA.

As described above, the functional module FM may overlap or correspond to the transmission area TA. In an embodiment, as shown in FIG. 4, the functional module FM may be disposed under the substrate 100. That is, the functional module FM may be disposed facing the transistor layer 200 with the substrate 100 therebetween. In an embodiment, a penetration hole (not shown) passing through the substrate 100 may be formed or provided in the substrate 100 to overlap the transmission area TA. The functional module FM may be disposed inside the penetration hole.

The substrate 100 may be formed of or include a transparent or opaque material. Examples of the material that can be used as the substrate 100 may include glass, quartz, plastic, and the like. These may be used alone or in combination with each other. In an embodiment, the substrate 100 may include polyimide ("PI"). In this case, the substrate 100 may have a structure in which one or more polyimide layers and one or more barrier layers are alternately stacked.

The buffer layer 110 may be disposed on the substrate 100. The buffer layer 110 may reduce or effectively prevent metal atoms or impurities from diffusing from the substrate 100 into the transistor layer 200. In an embodiment, the buffer layer 110 may control a heat transfer rate during a crystallization process for forming the first to third active patterns ACT1, ACT2, and ACT3.

The first to third active patterns ACT1, ACT2, and ACT3 may be disposed on the buffer layer 110. In an embodiment, the first to third active patterns ACT1, ACT2, and ACT3 may be formed of a silicon semiconductor or an oxide semiconductor.

Examples of the material that can be used for the silicon semiconductor may include amorphous silicon, polycrystalline silicon, and the like. These may be used alone or in combination with each other.

Examples of materials that can be used as the oxide semiconductor may include zinc oxide ("ZnOx"), gallium oxide ("GaOx"), titanium oxide ("TiOx"), tin oxide ("SnOx"), indium oxide ("InOx"), indium-gallium oxide ("IGO"), indium-zinc oxide ("IZO"), indium-tin oxide ("ITO"), gallium-zinc oxide ("GZO"), zinc-magnesium oxide ("ZMO"), zinc-tin oxide ("ZTO"), zinc-zirconium oxide ("ZnZrxOy"), indium-gallium-zinc oxide ("IGZO"), indium-zinc-tin oxide ("IZTO"), indium-gallium-hafnium oxide ("IGHO"), tin-aluminum-zinc oxide ("TAZO"), indium-gallium-tin oxide ("IGTO"), etc. These may be used alone or in combination with each other.

The gate insulating layer GI may cover the first to third active patterns ACT1, ACT2, and ACT3, and may be disposed on the buffer layer 110. The gate insulating layer GI may be formed of an insulating material. Examples of the insulating material that may be used as the gate insulating layer GI may include silicon oxide ("SiOx"), silicon nitride ("SiNx"), silicon oxynitride ("SiON"), or the like. These may be used alone or in combination with each other.

The first to third gate electrodes GAT1, GAT2, and GAT3 may be disposed on the gate insulating layer GI. The first to third gate electrodes GAT1, GAT2, and GAT3 may be formed of a metal, an alloy, a conductive metal oxide, a transparent conductive material, or the like. Examples of materials that can be used as the first to third gate electrodes GAT1, GAT2, and GAT3 may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like. These may be used alone or in combination with each other.

The interlayer insulating layer ILD may cover the first to third gate electrodes GAT1, GAT2, and GAT3 and may be disposed on the gate insulating layer GI. The interlayer insulating layer ILD may be formed of an insulating material.

The first to third source electrodes SE1, SE2, and SE3 and the first to third drain electrodes DE1, DE2, and DE3 may be disposed on the interlayer insulating layer ILD. The first source electrode SE1 and the first drain electrode DE1 may contact the first active pattern ACT1, the second source electrode SE2 and the second drain electrode DE2 may contact the second active pattern ACT2, and the third source electrode SE3 and the third drain electrode DE3 may contact the third active pattern ACT3. The first to third source electrodes SE1, SE2, and SE3 and the first to third drain electrodes DE1, DE2, and DE3 may be formed of a metal, an alloy, a conductive metal oxide, a transparent conductive material, or the like.

The via insulating layer VIA may cover the first to third source electrodes SE1, SE2, and SE3 and the first to third drain electrodes DE1, DE2, DE3, and may be disposed on the interlayer insulating layer ILD. The via insulating layer VIA may be formed of an organic insulating material. Examples of the material that can be used as the via insulating layer VIA may include photoresist, polyacrylic resin, polyimide resin, acrylic resin, etc. These may be used alone or in combination with each other.

Referring to FIGS. 4 and 6, the light emitting diode layer 300 may include first to third pixel electrodes PE1, PE2, and PE3, first to third emission layers EL1, EL2, and EL3, and a common electrode CE. In an embodiment, for example, the first pixel electrode PE1, the first emission layer EL1, and the common electrode CE may constitute the first red light emitting diode R1. The second pixel electrode PE2, the second emission layer EL2, and the common electrode CE may constitute the first green light emitting diode G1. The third pixel electrode PE3, the third emission layer EL3, and the common electrode CE may constitute the first blue light emitting diode B1.

The encapsulation layer 400 may include a first inorganic layer 410, an organic layer 420, and a second inorganic layer 430.

The color filter layer 600 may include a first color filter RCF, a second color filter GCF, a third color filter BCF, and a light blocking member BM. In an embodiment, the first color filter RCF may correspond to the first red light emitting diode R1. The second color filter GCF may correspond to the first green light emitting diode G1. The third color filter BCF may correspond to the first blue light emitting diode B1. The light blocking member BM may be disposed between adjacent color filters among the first to third color filters RCF, GCF, and BCF.

The first to third pixel electrodes PE1, PE2, and PE3 may be disposed on the via insulating layer VIA and may be connected to the first to third drain electrodes DE1, DE2, and DE3. The first to third pixel electrodes PE1, PE2, and PE3 may be formed of a metal, an alloy, a conductive metal oxide, a transparent conductive material, or the like.

A pixel defining layer PDL may be disposed on the via insulating layer VIA. Openings exposing each of the first to third pixel electrodes PE1, PE2, and PE3 to outside the pixel defining layer PDL may be formed in the pixel defining layer PDL. The pixel defining layer PDL may be formed of an organic material. Examples of the material that can be used as the pixel defining layer PDL may include photoresist, polyacrylic resin, polyimide resin (particularly, photosensitive polyimide resin). ("PSPI")), acrylic resin, and the like. These may be used alone or in combination with each other.

In addition, a colorant may be added to the pixel defining layer PDL. In an embodiment, for example, a black pigment may be added to the pixel defining layer PDL.

The first to third emission layers EL1, EL2, and EL3 may be respectively disposed on the first to third pixel electrodes PE1, PE2, and PE3. In an embodiment, the first emission layer EL1 may include an organic emission layer emitting red light, the second emission layer EL2 may include an organic emission layer emitting green light, and the third emission layer EL3 may include an organic emission layer emitting blue light. In addition, each of the first to third emission layers EL1, EL2, and EL3 may further include a hole injection layer, a hole transport layer, an electron transport layer, and an electron injection layer.

The common electrode CE may be disposed on the first to third emission layers EL1, EL2, and EL3. The common electrode CE may be formed of a metal, an alloy, a conductive metal oxide, a transparent conductive material, or the like.

In an embodiment, thicknesses of the first light emitting diodes R1, G1, and B1 may be different from each other. In other words, thicknesses of the first to third emission layers EL1, EL2, and EL3 may be different from each other, or thicknesses of the first to third pixel electrodes PE1, PE2, and PE3 may be different from each other to define the different thicknesses of the first light emitting diodes R1, G1, and B1.

Referring to FIG. 6, the first red light emitting diode R1 may have a first light emitting thickness THR1, the first green light emitting diode G1 may have a second light emitting thickness THG1, and the first blue light emitting diode B1 may have a third light emitting thickness THB1. A light emitting thickness may be a total thickness of a respective pixel electrode, a respective emission layer and a respective portion of the common electrode CE. The first light emitting thickness THR1 may be greater than the second light emitting thickness THG1, and the second light emitting thickness THG1 may be greater than the third light emitting thickness THB1. However, the invention is not limited thereto. In an embodiment, for example, a magnitude relation of the first to third light emitting thicknesses THR1, THG1, and THB1 may be set as necessary.

The encapsulation layer 400 may be disposed on the common electrode CE. Penetration of oxygen and/or moisture into the first light emitting diodes R1, G1, and B1 may be reduced or effectively prevented by the encapsulation layer 400. The first inorganic layer 410 and the second inorganic layer 430 may be formed of an inorganic material. The organic layer 420 may be disposed between the first and second inorganic layers 410 and 430 and may be formed of an organic material. That is, the first inorganic layer 410 and the second inorganic layer 430 may face each other with the organic layer 420 therebetween. In addition, at least one inorganic layer and at least one organic layer may be further stacked on the encapsulation layer 400.

The sensing layer 500 may be disposed on the encapsulation layer 400. A plurality of sensing electrodes may be formed within the sensing layer 500, and the sensing layer 500 may detect an external touch.

The light blocking member BM may be disposed on the sensing layer 500 as a light blocking pattern. The light blocking member BM may overlap the pixel defining layer PDL along the thickness direction of the display device 11. In addition, the light blocking member BM may partition regions in which the first to third color filters RCF, GCF, and BCF are disposed. The light blocking member BM may be a solid portion among solid portions of a light blocking layer and the regions partitioned by the light blocking member BM may be openings defined by the solid portions. The light blocking member BM may absorb and/or block light. Examples of the material that can be used as the light blocking member BM may include chromium, chromium oxide, and the like. These may be used alone or in combination with each other.

The first to third color filters RCF, GCF, and BCF may be disposed on the sensing layer 500 and corresponding to the solid portions of the light blocking layer. The first color filter RCF may overlap the first red light emitting diode R1, the second color filter GCF may overlap the first green light emitting diode G1, and the third color filter BCF may overlap the first blue light emitting diode B1. Each of the first to third color filters RCF, GCF, and BCF may selectively transmit light in a wavelength band.

The overcoat layer 700 may be disposed on the color filter layer 600. The overcoat layer 700 may form an interface with the color filter layer 600, without being limited thereto. The overcoat layer 700 may include an organic material and/or an inorganic material. Examples of the material that can be used as the overcoat layer 700 may include polyimide, acryl, silicon oxide, silicon nitride, and the like. These may be used alone or in combination with each other.

In one embodiment, the overcoat layer 700 may include a colorant. Examples of materials that can be used as the colorant include organic pigment, red pigment, green pigment, blue pigment, and the like. These may be used alone or in combination with each other. Accordingly, the overcoat layer 700 may have a gray color.

The organic pigment may be a known pigment formed of an organic material and commonly used among pigments having a black color. In an embodiment, for example, the organic pigment may include acetylene black, aniline black, perylene black, and the like. These may be used alone or in combination with each other.

The red pigment, the green pigment, and the blue pigment may be known pigments commonly used among pigments having red, green, and blue colors, respectively. In an embodiment, for example, the red pigment may include a red pigment having a red color such as a reddish pigment, and C.I. pigment red-based pigments may be used as the red pigment. The green pigment may include a green pigment having a green color such as a greenish pigment, and C.I. pigment green-based pigments may be used as the green pigment. The blue pigment may include a blue pigment having a blue color such as a bluish pigment, and a phthalocyanine-based pigment, an indanthrone blue pigment, or the like may be used as the blue pigment. These may be used alone or in combination with each other.

As the overcoat layer 700 includes the colorant, the overcoat layer 700 may not be colorless. Accordingly, a content of the colorant may be directly related to the transmittance of the overcoat layer 700. In an embodiment, for example, as the content of the colorant increases within the overcoat layer 700, the transmittance of the overcoat layer 700 may decrease.

In an embodiment, the overcoat layer 700 overlapping the display area DA may have a flat top surface which is furthest from the substrate 100 and may have the first thickness TH1. In an embodiment, for example, the first thickness TH1 may be a maximum thickness of the overcoat layer 700 in the display area DA. In an embodiment, the first thickness TH1 may be greater than about 1.5 micrometers (μm) and smaller than about 3 μm.

In addition, the overcoat layer 700 overlapping the transmission area TA may have a flat top surface which is furthest from the substrate 100 and may have the second thickness TH2. In an embodiment, for example, the second thickness TH2 may be a maximum thickness of the overcoat layer 700 in the transmission area TA. The top surfaces of the overcoat layer 700 may form a step at a boundary between the display area DA and the transmission area TA.

The thickness of the overcoat layer 700 may be directly related to the transmittance of the overcoat layer 700. In an embodiment, for example, as the thickness of the overcoat layer 700 decreases, the transmittance of the overcoat layer 700 may increase. In addition, the first and second thicknesses TH1 and TH2 may be different from each other. In an embodiment, for example, the first and second thicknesses TH1 and TH2 may be formed to be different from each other by using a halftone mask. Accordingly, when the second thickness TH2 is smaller than the first thickness TH1, the second transmittance of the transmission area TA may be greater than the first transmittance of the display area DA.

In an embodiment, the overcoat layer 700 may include a ultraviolet ("UV") absorber. The ultraviolet absorber may be a material that absorbs and/or shields light having a wavelength of less than about 380 nanometers (nm). Examples of the material that can be used as the ultraviolet absorber may include hydroxyl-benzotriazole-based (HB-based), tris-resorcinol-triazine chromophore-based (TRTC-based), a hydroxyphenyl-benzotriazole chromophore ("HBC), and the like. These may be used alone or in combination with each other.

As the overcoat layer 700 includes the UV absorber, light stability of the display device 11 may be improved.

The adhesion layer 800 may be disposed on the overcoat layer 700. The adhesion layer 800 may adhere the window 900 to the overcoat layer 700. Examples of the material that can be used as the adhesion layer 800 may include a pressure sensitive adhesive ("PSA"), an optically colorless adhesive ("OCA"), an optically colorless resin ("OCR"), and the like. These may be used alone or in combination with each other. The window 900 may be disposed on the adhesion layer 800.

Figure 7:
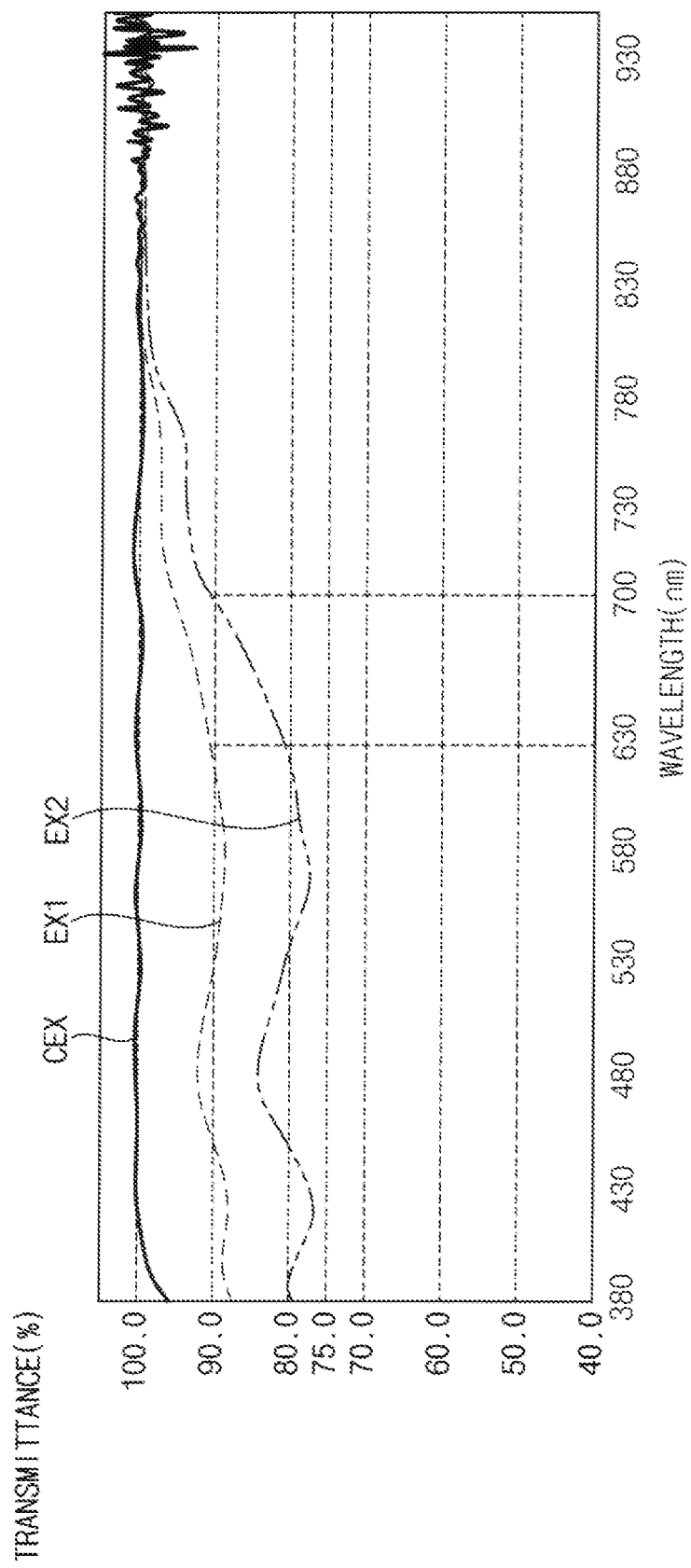
FIG. 7 is a graph illustrating a transmittance of an overcoat layer included in the display device of FIG. 4.

FIG. 7 is a graph illustrating a transmittance (in percent, %) of an overcoat layer 700 included in the display device 11 of FIG. 4.

Referring to FIG. 7, the X-axis of the graph represents wavelength of light, and the Y-axis of the graph represents the relatively transmittance of light wavelengths by the overcoat layer 700. The transmittance of each of the three types of overcoat layers with respect to light having a wavelength band was measured. A comparative example CEX is a result of measuring the transmittance of the overcoat layer 700 not containing the colorant, a first experimental example EX1 is a result of measuring the transmittance of the overcoat layer 700 containing the colorant as much as a first content, and a second experimental example EX2 is a result of measuring the transmittance of the overcoat layer 700 including the colorant as much as a second content. The second content is greater than the first content.

In the comparative example CEX, for light having a wavelength of about 380 nm to about 780 nm, the transmittance of the overcoat layer 700 was measured to be about 95% or more with respect to light having a wavelength of about 380 nm to about 780 nm.

On the other hand, in the first experimental example EX1, the transmittance of the overcoat layer 700 was measured to be about 85% to about 95% with respect to light having a wavelength of about 380 nm to about 630 nm. In addition, in the second experimental example EX2, the transmittance of the overcoat layer 700 was measured to be about 75% or more and about 90% or less with respect to light having a wavelength of about 380 nm to about 700 nm. That is, as the content of the colorant added to the overcoat layer 700 increased, the transmittance of the overcoat layer 700 decreased. In other words, as the content of the colorant is adjusted, the transmittance of the overcoat layer 700 may be adjusted.

In addition, in the first experimental example EX1 and the second experimental example EX2, the transmittance of the overcoat layer 700 was measured to be about 90% or more with respect to light having a wavelength of about 780 nm or more (e.g., infrared rays). In other words, even when the colorant is added to the overcoat layer 700, the transmittance of the overcoat layer 700 with respect to light having a wavelength of about 780 nm or more is maintained high.

One or more embodiment of the display device 11 may include the overcoat layer 700 to which the colorant is added. Since the color filter layer 600 and the overcoat layer 700 may replace a polarizer, the display device 11 may not include the polarizer. As the colorant is added to the overcoat layer 700, transmittance of the overcoat layer 700 may decrease. Accordingly, recognition of external light reflected from components (e.g., the common electrode CE, etc.) included in the display device 11 may be reduced or effectively prevented, and the display quality of the display device 11 may be improved.

In addition, the transmittance of the overcoat layer 700 may be defined according to the content of the colorant and/or the thickness of the overcoat layer 700. In an embodiment, for example, when the transmission area TA has a relatively high transmittance, the overcoat layer 700 overlapping the transmission area TA may have a small thickness.

In addition, as the overcoat layer 700 overlapping the display area DA has a flat top surface, the reflective color band phenomenon of the display device 11 may be improved. Furthermore, as the first to third light emitting thicknesses THR1, THG1, and THB1 of the light emission layer are respectively adjusted, the reflective color band phenomenon may be further improved.

Figure 8:
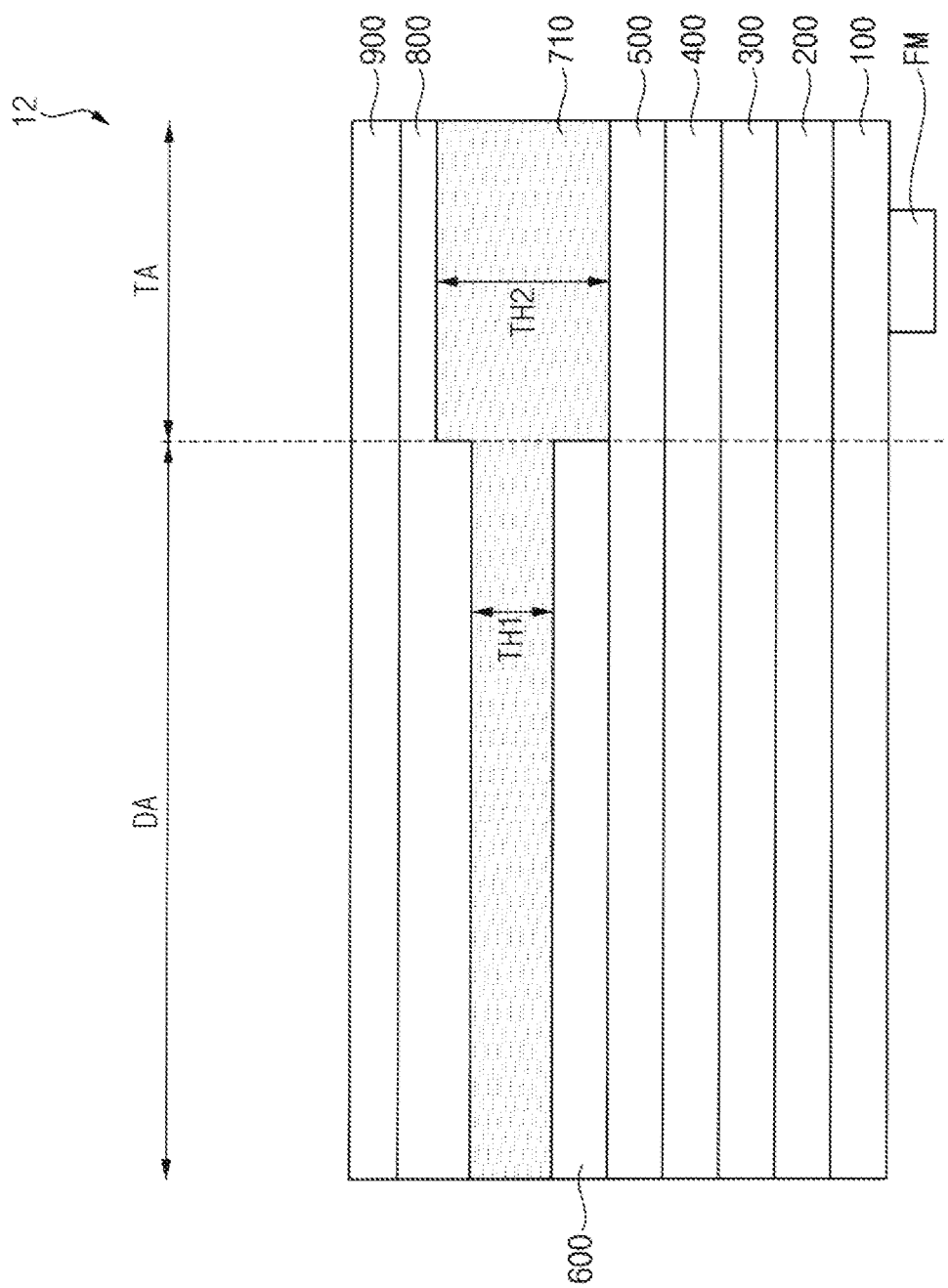
FIG. 8 and FIG. 9 are cross-sectional views illustrating an embodiment of a display device.
Figure 9:
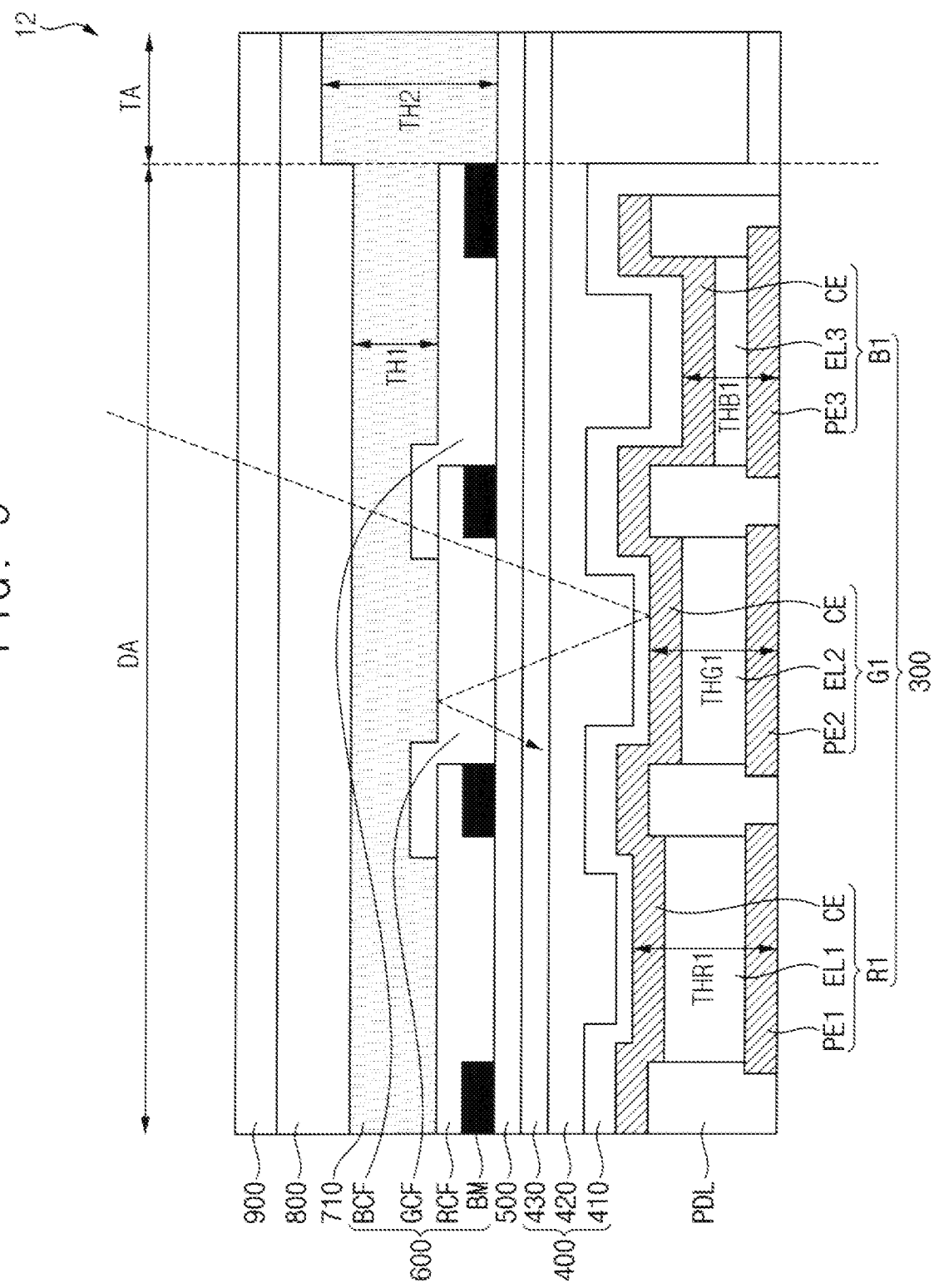

FIG. 8 and FIG. 9 are cross-sectional views illustrating an embodiment of a display device 12. For example, FIG. 8 is a cross-sectional view schematically illustrating the display device 12, and FIG. 9 is a cross-sectional view illustrating a light emitting diode layer 300, an encapsulation layer 400, a sensing layer 500, a color filter layer 600, an overcoat layer 710, an adhesion layer 800, and a window 900 which are included in the display device 12.

Referring to FIGS. 8 and 9, a display device 12 may include the functional module FM, the substrate 100, the buffer layer 110, the transistor layer 200, the light emitting diode layer 300, the encapsulation layer 400, the sensing layer 500, the color filter layer 600, an overcoat layer 710, the adhesion layer 800, and the window 900. The display device 12 may be substantially the same as the display device 11 described with reference to FIG. 4, except for a thickness of the overcoat layer 710.

In an embodiment, a first thickness TH1 of the overcoat layer 710 overlapping the display area DA may be different from a second thickness TH2 of the overcoat layer 710 overlapping the transmission area TA. The first thickness TH1 and the second thickness TH2 may be set according to transmittances of the display area DA and the transmission area TA. In an embodiment, for example, as shown in FIG. 8, the first thickness TH1 may be smaller than the second thickness TH2. Accordingly, the first transmittance of the display area DA may be greater than the second transmittance of the transparent area TA.

The top surfaces of the overcoat layer 710 which are furthest from the substrate 100 may form a step at a boundary between the display area DA and the transmission area TA. Bottom surfaces of the overcoat layer 710 which are closest from the substrate 100 may form a step at a boundary between the display area DA and the transmission area TA. That is, along the thickness direction, a portion of the overcoat layer 710 corresponding to the transmission area TA may extend further in a direction toward the substrate 100 and in a direction away from the substrate 100, than a portion of the overcoat layer 710 corresponding to the display area DA.

Figure 10:
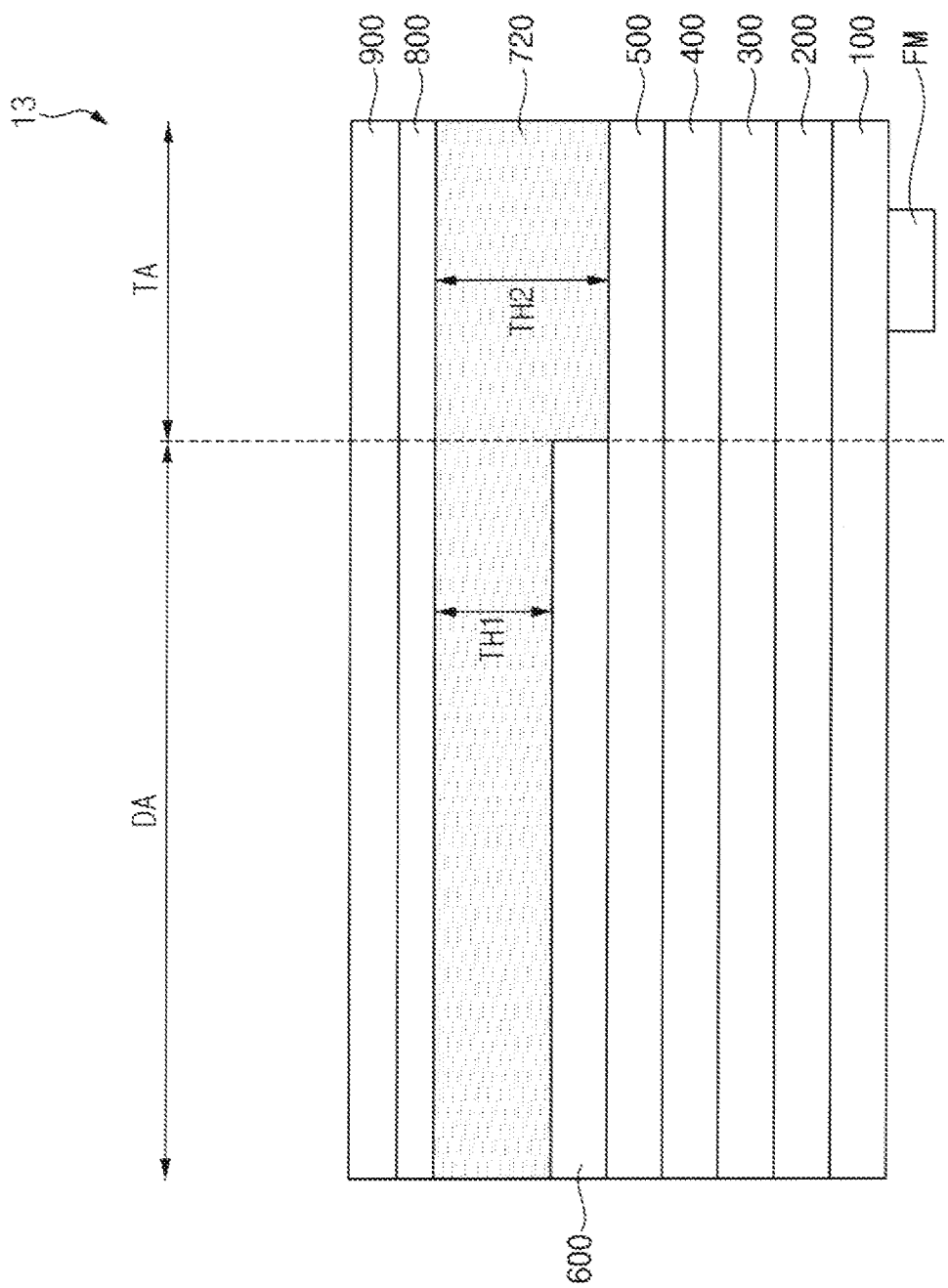
FIG. 10 and FIG. 11 are cross-sectional views illustrating an embodiment of a display device.
Figure 11:
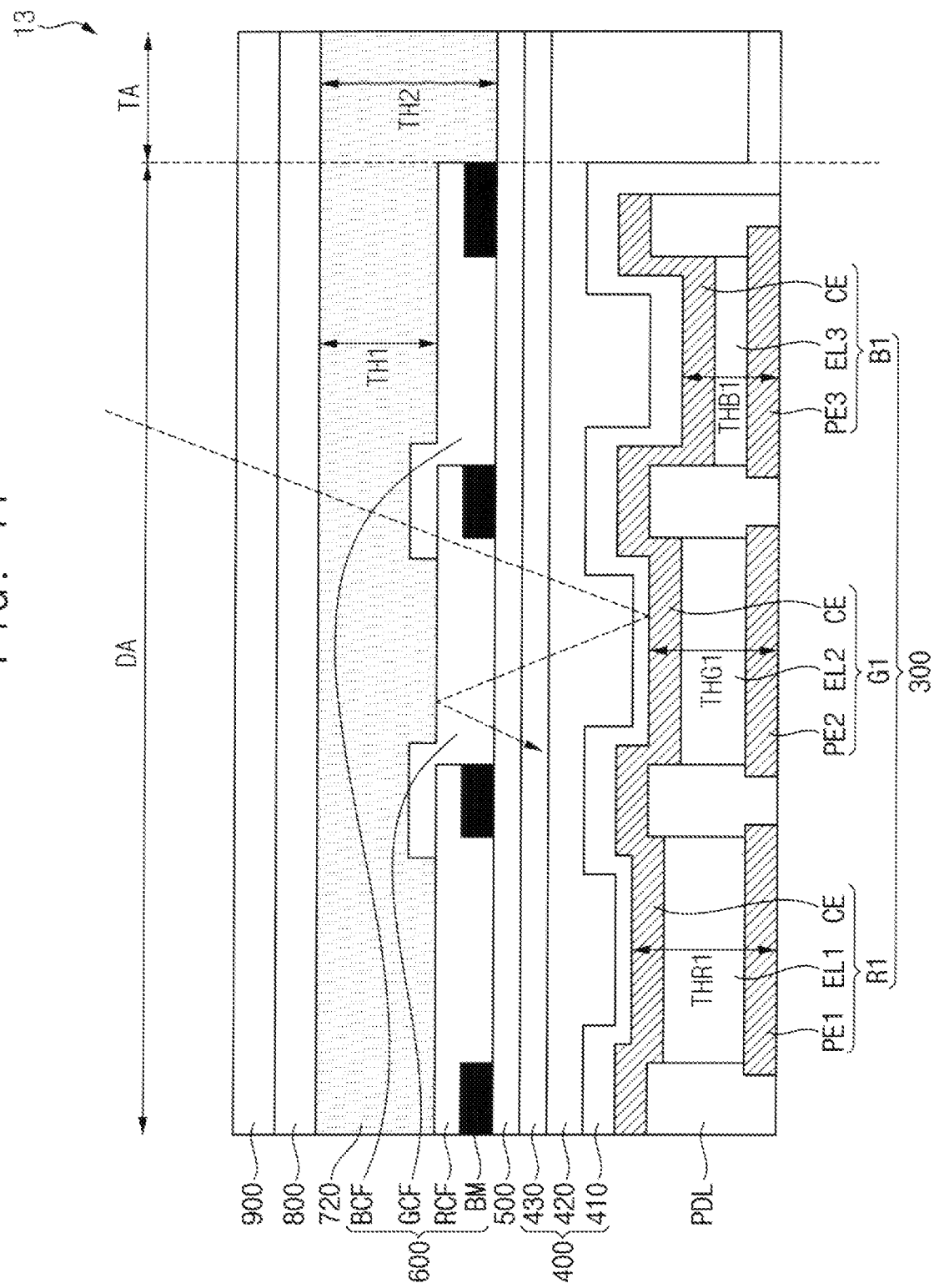

FIG. 10 and FIG. 11 are cross-sectional views illustrating an embodiment of a display device 13. For example, FIG. 10 is a cross-sectional view schematically illustrating the display device 13, and FIG. 11 is a cross-sectional view illustrating a light emitting diode layer 300, an encapsulation layer 400, a sensing layer 500, a color filter layer 600, an overcoat layer 720, an adhesion layer 800, and a window 900 which are included in the display device 13.

Referring to FIGS. 10 and 11, a display device 13 may include the functional module FM, the substrate 100, the buffer layer 110, the transistor layer 200, the light emitting diode layer 300, the encapsulation layer 400, the sensing layer 500, the color filter layer 600, an overcoat layer 720, the adhesion layer 800, and the window 900. The display device 13 may be substantially the same as the display device 11 described with reference to FIG. 4, except for a thickness of the overcoat layer 720.

In an embodiment, a first thickness TH1 of the overcoat layer 720 overlapping the display area DA may be different from a second thickness TH2 of the overcoat layer 720 overlapping the transmission area TA. The first thickness TH1 and the second thickness TH2 may be set according to transmittances of the display area DA and the transmission area TA. In an embodiment, for example, as shown in FIG. 10, the first thickness TH1 may be smaller than the second thickness TH2. In addition, the overcoat layer 720 may have a top surface which is furthest from the substrate 100. The top surface of the overcoat layer 720 at the display area DA may be positioned in a same plane as a top surface of the overcoat layer 720 at the transmission area TA. That is, the top surface of the overcoat layer 720 at the display area DA may be coplanar with the top surface of the overcoat layer 720 at the transmission area TA. Accordingly, the first transmittance of the display area DA may be greater than the second transmittance of the transparent area TA.

Although embodiments and implementations have been described herein, other embodiments and modifications will be apparent from this description. Accordingly, the invention is not limited to such embodiments, but rather various obvious modifications and equivalent arrangements would be apparent to a person of ordinary skill in the art.

What is claimed is:

1. A display device comprising:
   a substrate including
      a display area including light emitting diodes, and
      a transmission area including a functional module which provides a function to the display device, the transmission area being adjacent to the display area; and
   in order from the substrate:
      a light emitting diode layer including a pixel defining layer in which openings are defined, and the light emitting diodes which are respectively in the openings and emit light;
      a color filter layer including color filters respectively corresponding to the light emitting diodes, and a light blocking member which is between the color filters;

an overcoat layer which includes a colorant, the overcoat layer which includes the colorant covering an entirety of an upper surface of each of the color filters in the display area and extending from the display area to the transmission area; and
a window.

2. The display device of claim 1, wherein the colorant includes an organic pigment.

3. The display device of claim 2, wherein the organic pigment includes acetylene black, aniline black or perylene black.

4. The display device of claim 1, wherein the colorant includes a red pigment, a green pigment or a blue pigment.

5. The display device of claim 4, wherein
the red pigment has a red color,
the green pigment has a green color, and
the blue pigment has a blue color.

6. The display device of claim 1, wherein
the display area has a first transmittance,
the transmission area has a second transmittance different from the first transmittance,
the overcoat layer has a first thickness in the display area and a second thickness in the transmission area, and
the first thickness of the overcoat layer is different from the second thickness of the overcoat layer.

7. The display device of claim 6, wherein
the second transmittance of the transmission area including the functional module is greater than the first transmittance of the display area including the light emitting diodes, and
the second thickness of the overcoat layer which is in the transmission area is smaller than the first thickness of the overcoat layer which is in the display area.

8. The display device of claim 6, wherein
the second transmittance of the transmission area including the functional module is smaller than the first transmittance of the display area including the light emitting diodes, and
the second thickness of the overcoat layer which is in the transmission area is greater than the first thickness of the overcoat layer which is in the display area.

9. The display device of claim 6, wherein the first thickness of the overcoat layer which is in the display area is greater than about 1.5 micrometers and smaller than about 3 micrometers.

10. The display device of claim 6, wherein the functional module faces the light emitting diode layer with the substrate therebetween.

11. The display device of claim 6, wherein
the light emitting diodes includes a number per unit area of the light emitting diodes in the transmission area and in the display area, and
the number per unit area of the light emitting diodes in the transmission area is smaller than the number per unit area of the light emitting diodes in the display area.

12. The display device of claim 1, further comprising an adhesion layer which is between the overcoat layer and the window and adheres the window to the overcoat layer.

13. The display device of claim 12, wherein the adhesion layer includes a pressure sensitive adhesive, an optically clear adhesive or an optically transparent resin.

14. The display device of claim 1, wherein the overcoat layer which includes the colorant further includes an ultraviolet absorber which shields light having a wavelength of less than about 380 nanometers.

15. The display device of claim 1, wherein the overcoat layer which includes the colorant has a transmittance greater than about 75% and smaller than about 90% for light having a wavelength greater than about 380 nanometers and smaller than about 700 nanometers.

16. The display device of claim 1, wherein
the light emitting diodes include a red light emitting diode which emits red light, a green light emitting diode which emits green light, and a blue light emitting diode which emits blue light,
each of the red light emitting diode, the green light emitting diode and the blue light emitting diode has a thickness, and
the thickness of the red light emitting diode, the thickness of the green light emitting diode, and the thickness of the blue light emitting diode are different from each other.

17. A display device comprising:
a light emitting diode layer including a pixel defining layer in which openings are defined, and light emitting diodes which are respectively in the openings and emit light;
a substrate including:
a display area including the light emitting diodes and having a first transmittance, and
a transmission area being adjacent to the display area and having a second transmittance different from the first transmittance;
a color filter layer facing the light emitting diode layer, the color filter layer including color filters respectively corresponding to the light emitting diodes and a light blocking member which is between the color filters;
an overcoat layer which includes a colorant, the overcoat layer which includes the colorant covering an entirety of an upper surface of each of the color filters of the color filter layer, extending from the display area to the transmission area and including:
a first thickness corresponding to the display area, and
a second thickness corresponding to the transmission area,
wherein the second thickness is different from the first thickness; and
a window facing the substrate with each of the light emitting diode layer, the color filter layer and the overcoat layer therebetween.

18. The display device of claim 17, wherein
the second transmittance of the transmission area is greater than the first transmittance of the display area, and
the second thickness of the overcoat layer which corresponds to the transmission area is smaller than the first thickness of the overcoat layer which corresponds to the display area.

19. The display device of claim 17, wherein
the second transmittance of the transmission area is smaller than the first transmittance of the display area, and
the second thickness of the overcoat layer which corresponds to the transmission area is greater than the first thickness of the overcoat layer which corresponds to the display area.

20. The display device of claim 1, wherein the overcoat layer which covers the color filters of the color filter layer further covers the light blocking member of the color filter layer.

* * * * *